(12) United States Patent
Cheng et al.

(10) Patent No.: US 10,001,963 B2
(45) Date of Patent: Jun. 19, 2018

(54) DYNAMIC RANDOM ACCESS MEMORY

(71) Applicant: ALSON TECHNOLOGY LIMITED, Kowloon (HK)

(72) Inventors: Han-Hung Cheng, Zhubei (TW); Chi-Fen Kuo, Zhubei (TW)

(73) Assignee: Alson Technology Limited, Kowloon (HK)

( * ) Notice: Subject to any disclaimer, the term of this patent is extended or adjusted under 35 U.S.C. 154(b) by 0 days. days.

(21) Appl. No.: 15/649,949

(22) Filed: Jul. 14, 2017

(65) Prior Publication Data

US 2017/0315768 A1 Nov. 2, 2017

Related U.S. Application Data

(63) Continuation-in-part of application No. 14/955,923, filed on Dec. 1, 2015, now abandoned.

(51) Int. Cl.
| | |
|---|---|
| *G06F 3/14* | (2006.01) |
| *G06F 3/147* | (2006.01) |
| *G11C 11/4096* | (2006.01) |
| *G09G 3/14* | (2006.01) |
| *G09G 3/20* | (2006.01) |

(52) U.S. Cl.
CPC ............ *G06F 3/147* (2013.01); *G09G 3/14* (2013.01); *G09G 3/2003* (2013.01); *G11C 11/4096* (2013.01); *G09G 2320/0666* (2013.01); *G09G 2320/08* (2013.01); *G09G 2320/10* (2013.01)

(58) Field of Classification Search
CPC ....... G06F 3/147; G09G 3/14; H01L 27/1214; H01L 2924/12044; H01L 27/12; H03K 19/1776; H03K 19/0013
See application file for complete search history.

(56) References Cited

U.S. PATENT DOCUMENTS

| | | |
|---|---|---|
| 6,104,658 A | 8/2000 | Lu |
| 2006/0045168 A1 | 3/2006 | Socci et al. |
| 2013/0207170 A1 | 8/2013 | Kurokawa |
| 2015/0255446 A1 | 9/2015 | Onodera et al. |
| 2015/0269973 A1* | 9/2015 | Sugita ................... G11C 5/04 365/185.05 |
| 2015/0380094 A1* | 12/2015 | Nagashima ........... G11C 16/10 365/185.19 |

FOREIGN PATENT DOCUMENTS

TW         201520737 A     6/2015

* cited by examiner

*Primary Examiner* — Kabir A Timory
(74) *Attorney, Agent, or Firm* — Muncy, Geissler, Olds & Lowe, P.C.

(57) ABSTRACT

A dynamic random access memory, including a main body, a processing unit, a display screen and a transmit port. The main body has a substrate and a shell portion disposed by two opposite side faces of the substrate, the substrate is provided with a memory module; the processing unit is disposed in the main body; the display screen is attached to the main body and viewable from outside of the dynamic random access memory, the display screen is electrically connected with the processing unit, the processing unit can control a display state of the display screen; and the transmit port is disposed on the substrate, and the transmit port is electrically connected with the memory module.

9 Claims, 3 Drawing Sheets

DYNAMIC RANDOM ACCESS MEMORY

The present invention is a CIP of application Ser. No. 14/955,923, filed Dec. 1, 2015, the entire contents of which are hereby incorporated by reference.

BACKGROUND OF THE INVENTION

Field of the Invention

Description of the Prior Art

A dynamic random access memory as disclosed in TW201520737 includes a substrate, a boosting circuit and a plasma tube. The boosting circuit is disposed on the substrate and electrically connected with two power output ends; and two opposite ends of the plasma tube have two electrodes electrically connected the two power output ends.

When in actual practice, the plasma tube of the conventional dynamic random access memory has limited variations.

In addition, when the memory does not function normally, a user is unable to know the state of the memory (for example, capacity and temperature) from the appearance of the memory to find out the cause.

US20150255446 discloses that "Output device(s) 2116 such as a display (e.g., a computer monitor and/or a projection system), speakers, printer, network peripherals, etc." That is, the output device(s) 2116 is(are) not fixedly attached to the main body of a DRAM but connected to the processing unit 2102 of a computer by an element such as Universal Serial Bus.

US20060045168 discloses that the temperature display 20 includes a plurality of light-emitting diodes (LEDs) 48 *a*-48 *f*. The LEDs 48*a* and 48 *b* are adapted to be illuminated when the temperature of the memory circuits 14 are at or below the WARN threshold. The LEDs 48 *c* and 48 *d* are adapted to be illuminated when the temperature exceeds the WARN threshold, indicating that some remedial action (e.g., operating a fan at low speed to cool the memory circuits 14) should be taken. The LEDs 48 *e* and 48 *f* are adapted to be illuminated when the temperature exceeds the ALARM threshold, indicating that immediate action (e.g., turning off an associated computer system or operating a fan at high speed) should be taken to prevent damage to the memory circuits 14. In other words, the LEDs 48 *a* and 48 *b*, LEDs 48 *c* and 48 *d* and LEDs 48 *e* and 48 *f* are respectively illuminated in respective one light color (green, yellow, red) and not illuminated at the same time. The LEDs are not divided into a pattern portion and a background portion, and the processing unit does not control the LEDs according to the temperature sensing signal to illuminate in different colors at the same time. It is noted that every set of two LEDs is illuminated in one light color, and it is not possible to show a number or a symbol of the temperature.

U.S. Pat. No. 6,104,658 display device 2405 is externally coupled to a computer (system 2412 is a x86 architecture computer system well known in the art) but not connected to the processing unit to the processing unit of a DRAM. The display device 2405 is used for displaying information according to input information from external peripheral input components such as alphanumeric and function keys coupled to the bus 2400. It has nothing to do with that the processing unit is able to control color states of the pattern portion and the background portion, respectively, according to the temperature sensing signal to show different colors at the same time.

US20150255446, US20060045168 and U.S. Pat. No. 6,104,658, alone or in combination, do not disclose that a flat mounting board of the shell and a printed circuit board are the same in thickness, and the flat mounting board and that the printed circuit board are aligned with each other to form a combination flat solid panel. Besides, US20150255446, US20060045168 and U.S. Pat. No. 6,104,658, alone or in combination, do not disclose that an electric insert head extending from a printed circuit board is detachably electrically connected to an electric insert slot of the substrate and that an electric cable is longer than a width of the printed circuit board.

The present invention has arisen to mitigate and/or obviate the afore-described disadvantages.

SUMMARY OF THE INVENTION

The major object of the present invention is to provide a dynamic random access memory, wherein compared with a conventional plasma tube, a display screen can show various states according to a processing unit, and the dynamic random access memory is more pleasant to the eye.

In addition, pattern variations on the display screen allow a user to know the state of the dynamic random access memory conveniently.

To achieve the above and other objects, a dynamic random access memory is provided, including a main body, a processing unit, a display screen and a transmit port. The main body has a substrate and a shell portion disposed by two opposite side faces of the substrate, the substrate is provided with a memory module; the processing unit is disposed in the main body; the display screen is attached to the main body and is viewable from outside of the dynamic random access memory, the display screen and the processing unit are electrically connected with each other, the processing unit can control a display state of the display screen; and the transmit port is disposed on the substrate, and the transmit port is electrically connected with the memory module.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
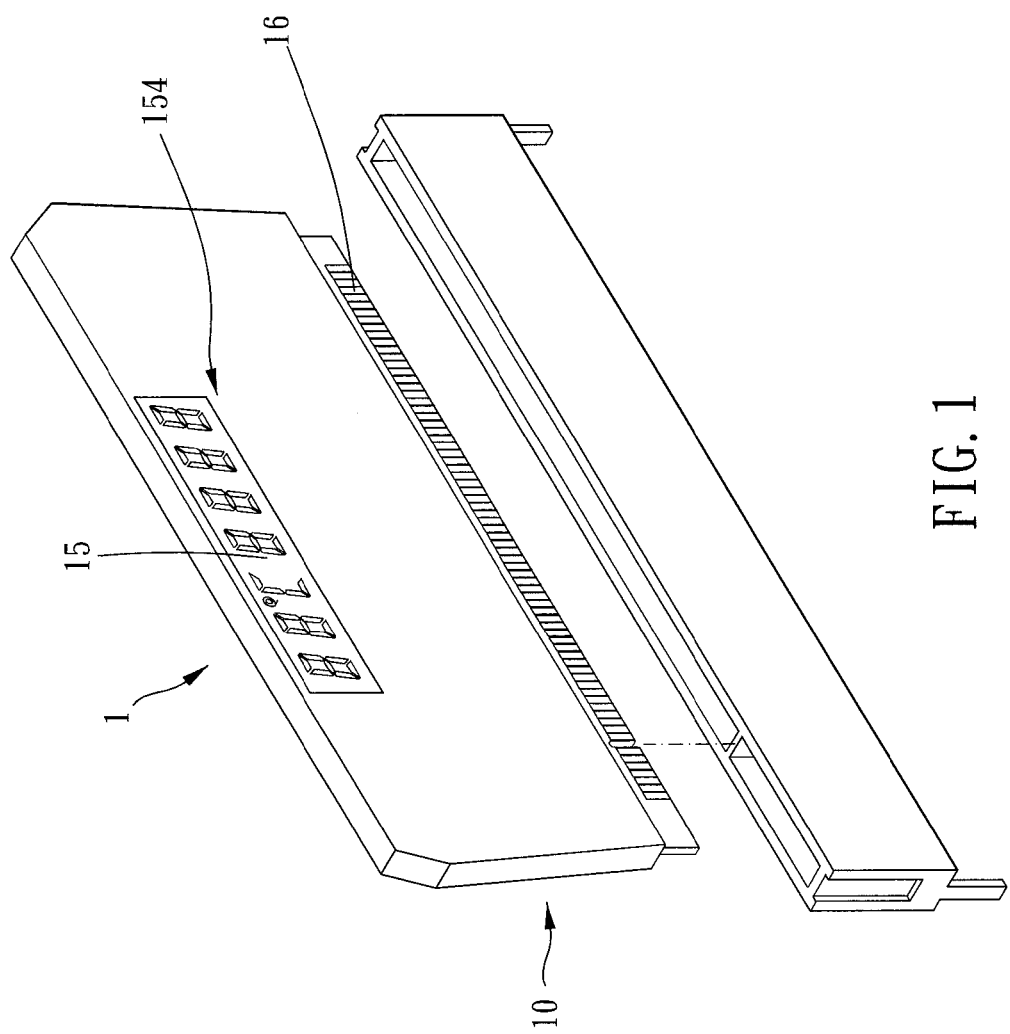
FIG. 1 is a perspective view of a preferred embodiment of the present invention.
Figure 2:
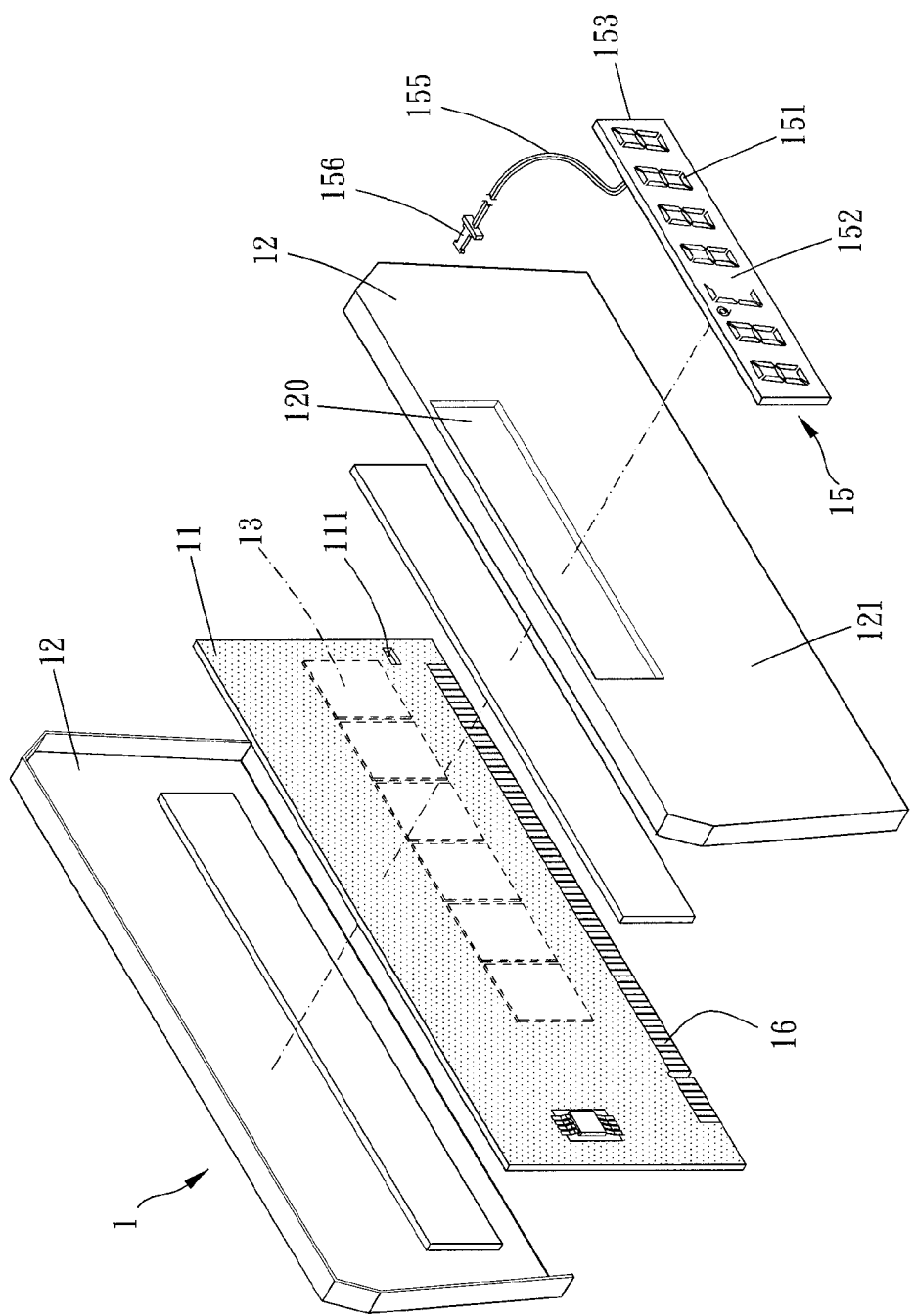
FIG. 2 is a breakdown view of the preferred embodiment of the present invention.
Figure 3:
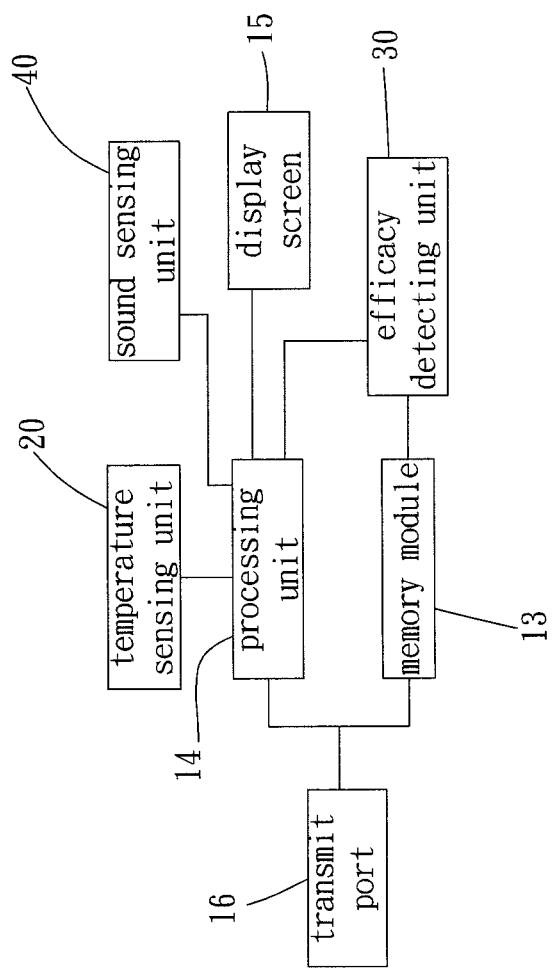
FIG. 3 is a diagram showing a structural relationship of the preferred embodiment of the present invention.

Please refer to FIGS. 1 to 3 for a preferred embodiment of the present invention. A dynamic random access memory 1 includes a main body 10, a processing unit 14, a display screen 15 and a transmit port 16.

The main body 10 has a substrate 11 and a shell portion 12 disposed by two opposite side faces of the substrate 11, the substrate 11 is provided with a memory module 13, and the processing unit 14 is disposed in the main body 10.

In this embodiment, the transmit port 16 is disposed on the substrate 11, and the transmit port 16 is electrically connected with the memory module 13. More specifically, to cooperate with different insert slots in different specifications, the transmit port 16 may be a USB, a SATA or an IDE transmit port.

The display screen 15 is attached to the main body 10 and is viewable from outside of the dynamic random access memory 1, the display screen 15 and the processing unit 14 are electrically connected with each other, and the processing unit 14 can control a display state (for example, a temperature state or an efficacy state of the dynamic random access memory 1) of the display screen 15. In this embodiment, the shell portion 12 includes a flat mounting board 121, the flat mounting board 121 is further provided with a hollow-out portion 120, and the display screen 15 includes a printed circuit board 153, the printed circuit board 153 is flat and is engaged and embedded within the hollow-out portion 120, the flat mounting board 121 and the printed circuit board 153 are the same in thickness, and the flat mounting board 121 and the printed circuit board 153 are aligned with each other to form a combination flat solid panel 154; in other embodiments, the display screen may be disposed on the substrate, the shell portion may be provided with a light-transmittable portion (the light-transmittable portion may be a hollow-out structure or a layer made of a light-transmittable material) so that the display screen can be viewed from the light-transmittable portion (the display screen may also be arranged between the shell portion and the substrate).

The substrate 11 further includes an electric insert slot 111, the display screen 15 further includes an electric cable 155 electrically connected to the printed circuit board 153 and having an electric insert head 156, the electric insert head 156 is detachably electrically connected to the electric insert slot 111, and the electric cable 155 is longer than a width of the printed circuit board 153.

In this embodiment, the processing unit 14 is electrically connected with the transmit port 16, and the substrate 11 is a circuit board; therefore, the processing unit 14 and the transmit port 16 can be electrically connected with each other through a circuit embedded in the substrate 11. In other embodiments, the processing unit may be connected with other exterior powers (for example, a mother board) directly instead of being electrically connected with the transmit port.

The display screen 15 includes a pattern portion 151 and a background portion 152, the processing unit 14 can control color states of the pattern portion 151 and the background portion 152 respectively, and the pattern portion 151 and the background portion 152 are, at the same time, in different colors; therefore, the display screen 15 can show a state of the dynamic random access memory 1 through patterns or words. In this embodiment, the display screen 15 is an organic light-emitting diode (OLED) display screen; however the display screen 15 may be an active-matrix OLED (AMOLED), passive matrix OLED (PMOLED) or super AMOLED which is pliable and thin. It is understandable that the display screen may be a digital, liquid crystal display, thin-film transistor, hot cathode fluorescent lamp or cold cathode fluorescent lamp display screen.

In this embodiment, the processing unit 14 is electrically connected with a temperature sensing unit 20, the temperature sensing unit 20 can sense a temperature of at least one of the substrate 11, the memory module 13 and the display screen 15 to produce a sensing signal, and the processing unit 14 can control the display screen 15 to show a temperature state according to the sensing signal. Specifically, the processing unit 14 can control the pattern portion 151 of the display screen 15 to show a number or a symbol of the temperature and control the background portion 152 to show different background colors (or flashing states) according to different temperature sections.

In addition, the processing unit 14 is further electrically connected with a sound sensing unit 40, the sound sensing unit 40 can sense a sound to produce a sensing signal, and the processing unit 14 can control the display state of the display screen 15 according to the sensing signal. For example, the processing unit 14 can control the pattern portion 151 of the display screen 15 to show a number or a symbol of a volume (or a tune) according to an intensity of the volume (or the tune) and control the background portion 152 to show different background colors (or flashing states) according to different volumes (or tunes); or the user can speak specific words (which have different sound waves) to the sound sensing unit 40 and make the processing unit 14 control the display state (patterns, colors or flashes) of the display screen 15.

The dynamic random access memory 1 is further provided with an efficacy detecting unit 30, the efficacy detecting unit 30 is electrically connected with the processing unit 14 and the memory module 13, the efficacy detecting unit 30 can detect an efficacy condition of the memory module 13 to produce an efficacy signal, and the processing unit 14 can control the display screen 15 to show an efficacy state according to the efficacy signal. More specifically, the efficacy detecting unit 30 can detect a capacity of the memory module 13, the efficacy signal is a capacity detecting signal, and the processing unit 14 can control the display screen 15 to show a capacity state according to the capacity detecting signal so that the user can view the state of the memory module 13 from outside without operating a computer. In addition, the efficacy detecting unit 30 can further detect a reading speed of the memory module 13, the efficacy signal is a reading speed detecting signal, and the processing unit 14 can control the display screen 15 to show a reading speed state according to the reading speed detecting signal. It is to be noted that in addition to the pattern portion 151 which can show reading speed state, the background portion 152 can produce colors or flashing states in accordance with different reading speeds.

Specifically, in other embodiments, the processing unit may not be electrically connected with the above-mentioned detecting units or sensing units, and the processing unit can control the display screen to show patterns corresponding to a preset programming built in the processing unit.

Given the above, compared with a traditional plasma tube, the display screen of the dynamic random access memory can show various display states according to the processing unit.

In addition, through the pattern variations of the display screen, the user can know the state of the dynamic random access memory conveniently and precisely.

While we have shown and described various embodiments in accordance with the present invention, it should be clear to those skilled in the art that further embodiments may be made without departing from the scope of the present invention.

What is claimed is:

1. A dynamic random access memory, including:
a main body, having a substrate and a shell portion disposed by two opposite side faces of the substrate, the substrate provided with a memory module;
a processing unit, disposed in the main body;
a display screen, fixedly attached to the main body and viewable from outside of the dynamic random access memory, electrically connected with the processing unit, the processing unit being able to control a display state of the display screen;
a transmit port, disposed on the substrate and electrically connected with the memory module;
wherein the processing unit is electrically connected with a temperature sensing unit, the temperature sensing unit is able to sense a temperature of at least one of the substrate, the memory module and the display screen to produce a sensing signal, and the processing unit is able to control the display screen to show a temperature state according to the sensing signal;
wherein the display screen includes a pattern portion and a background portion, the processing unit is able to control color states of the pattern portion and the background portion, respectively, according to the sensing signal, and the pattern portion and the background portion are, at the same time, in different colors;
wherein the shell portion includes a flat mounting board, the display screen includes a printed circuit board, the printed circuit board is flat and is engaged and embedded within the flat mounting board, the flat mounting board and the printed circuit board are the same in thickness, and the flat mounting board and the printed circuit board are aligned with each other to form a combination flat solid panel;
wherein the substrate further includes an electric insert slot, the display screen further includes an electric cable electrically connected to the printed circuit board and having an electric insert head, the electric insert head is detachably electrically connected to the electric insert slot, and the electric cable is longer than a width of the printed circuit board.

2. The dynamic random access memory of claim 1, wherein the processing unit is electrically connected with a sound sensing unit, the sound sensing unit is able to sense a sound to produce a sensing signal, and the processing unit is able to control the display state of the display screen according to the sensing signal.

3. The dynamic random access memory of claim 1, further provided with an efficacy detecting unit, the efficacy detecting unit electrically connected with the processing unit and the memory module, the efficacy detecting unit being able to detect an efficacy condition of the memory module to produce an efficacy signal, the processing unit being able to control the display screen to show an efficacy state according to the efficacy signal.

4. The dynamic random access memory of claim 3, wherein the efficacy detecting unit is able to detect a capacity of the memory module, the efficacy signal is a capacity detecting signal, and the processing unit is able to control the display screen to show a capacity state according to the capacity detecting signal.

5. The dynamic random access memory of claim 3, wherein the efficacy detecting unit is able to detect a reading speed of the memory module, the efficacy signal is a reading speed detecting signal, and the processing unit is able to control the display screen to show a reading speed state according to the reading speed detecting signal.

6. The dynamic random access memory of claim 1, wherein the transmit port is a USB, a SATA or an IDE transmit port.

7. The dynamic random access memory of claim 1, wherein the flat mounting board is provided with a hollow-out portion, and the printed circuit board is embedded in the hollow-out portion.

8. The dynamic random access memory of claim 1, wherein the processing unit is able to control the pattern portion to show a number or a symbol of the temperature and control the background portion to show different background colors or flashing states according to different temperature sections, and the pattern portion and the background portion are in different colors.

9. The dynamic random access memory of claim 1, wherein the display screen is an organic light-emitting diode (OLED) display screen.

* * * * *